United States Patent
Park et al.

(10) Patent No.: US 7,436,033 B2
(45) Date of Patent: Oct. 14, 2008

(54) TRI-GATED MOLECULAR FIELD EFFECT TRANSISTOR AND METHOD OF FABRICATING THE SAME

(75) Inventors: Chan Woo Park, Daejeon (KR); Sung Yool Choi, Daejeon (KR); Han Young Yu, Daejeon (KR); Ung Hwan Pi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 344 days.

(21) Appl. No.: 11/135,285

(22) Filed: May 24, 2005

(65) Prior Publication Data

US 2006/0102889 A1 May 18, 2006

(30) Foreign Application Priority Data

Nov. 18, 2004 (KR) .................. 10-2004-0094585

(51) Int. Cl.
*H01L 29/76* (2006.01)
*H01L 29/94* (2006.01)
*H01L 35/24* (2006.01)
*H01L 51/00* (2006.01)
*H01L 27/01* (2006.01)

(52) U.S. Cl. .............. 257/401; 257/40; 257/353; 257/E21.442; 977/936; 977/937; 977/938

(58) Field of Classification Search .......... 257/401, 257/353, 40, E21.442; 438/283, 157–160, 438/176, 82, 99; 977/936–938
See application file for complete search history.

(56) References Cited

U.S. PATENT DOCUMENTS

| 5,612,546 | A | * | 3/1997 | Choi et al. ............ 257/66 |
| 5,840,601 | A | * | 11/1998 | Cho ................... 438/151 |
| 6,586,787 | B1 | * | 7/2003 | Shih et al. ............ 257/288 |
| 6,740,910 | B2 | * | 5/2004 | Roesner et al. ........ 257/213 |
| 6,791,338 | B1 | | 9/2004 | Bratkovski et al. |
| 6,972,462 | B2 | * | 12/2005 | Orchard-Webb ........ 257/355 |
| 7,202,495 | B2 | * | 4/2007 | Unno ................. 257/40 |
| 2002/0171125 | A1 | | 11/2002 | Bao et al. |
| 2004/0001778 | A1 | | 1/2004 | Chen et al. |
| 2004/0159831 | A1 | * | 8/2004 | Khang ................ 257/17 |
| 2005/0064618 | A1 | * | 3/2005 | Brown et al. .......... 438/49 |
| 2006/0273356 | A1 | * | 12/2006 | Matsumoto et al. ..... 257/253 |

(Continued)

OTHER PUBLICATIONS

Lee, et al.; "Absence of Strong Gate Effects in Electrical Measurements on Phenylene-Based Conjugated Molecules"; Nano Letters, American Chemical Society; 2003; vol. 3, No. 2; pp. 113-117.

(Continued)

*Primary Examiner*—Shouxiang Hu
(74) *Attorney, Agent, or Firm*—Lowe Hauptman Ham & Berner, LLP

(57) ABSTRACT

A tri-gated molecular field effect transistor includes a gate electrode formed on a substrate and having grooves in a source region, a drain region and a channel region, and at least one molecule inserted between the source and drain electrodes in the channel region. The effects of the gate voltage on electrons passing through the channel can be maximized, and a variation gain of current supplied between the source and drain electrodes relative to the gate voltage can be greatly increased. Thus, a molecular electronic circuit having high functionality and reliability can be obtained.

8 Claims, 3 Drawing Sheets

U.S. PATENT DOCUMENTS

2007/0120111 A1* 5/2007 Nakamura et al. ............ 257/40

OTHER PUBLICATIONS

Liang, et al.; "Kondo resonance in a single-molecule transistor"; letters to nature, Nature Publishing Group; Jun. 13, 2002; vol. 417; pp. 725-729.

Park, et al.; "Coulomb blockade and the Kondo effect in single-atom transistors"; letters to nature, Nature Publishing Group; Jun. 13, 2002; vol. 417; pp. 722-725.

Park, et al.; "Nanomechanical oscillations in a single-$C_{60}$ transistor"; letters to nature, Macmillan Magazines Ltd; Sep. 7, 2000; vol. 417; pp. 57-60.

Park, et al.; "Fabrication of metallic electrodes with nanometer separation by electromigration"; Applied Physics Letters, American Institute of Physics; Jul. 12, 1999; vol. 75, No. 2; pp. 301-303.

* cited by examiner

TRI-GATED MOLECULAR FIELD EFFECT TRANSISTOR AND METHOD OF FABRICATING THE SAME

CROSS-REFERENCE TO RELATED APPLICATION

This application claims priority to and the benefit of Korean Patent Application No. 2004-94585, filed Nov. 18, 2004, the disclosure of which is incorporated herein by reference in its entirety.

BACKGROUND

1. Field of the Invention

The present invention relates to a tri-gated molecular field effect transistor (FET) and a method of fabricating the same and, more particularly, to a tri-gated molecular FET and a method of fabricating the same which can maximize a gate effect on a channel region having a length of several nm or less.

2. Discussion of Related Art

In recent years, the amount of information has increased exponentially as information and communication technologies have developed. In order to process the information, the integration density of silicon-based semiconductor devices also has been on the increase owing to the advancement of semiconductor technologies.

However, in the case of a top-down technique that scales down the size and linewidth of devices by improving the resolution of a photolithography process, as the channel length is reaching the level of several nm, the integration and performance of devices are limitedly improved while the cost of investment in equipment is rapidly augmented.

To overcome the drawback and produce economical nanoscale electronic devices, a bottom-up technique of fabricating molecular devices using molecular intrinsic properties, such as self-assembly and self-replication, has been proposed as an alternative option.

In a conventional molecular field effect transistor (FET), a channel having a length of several nm or less is formed between a source electrode and a drain electrode using organic molecules or nanoparticles having semiconductivity. This molecular FET is a three-terminal molecular device that controls the flow of electrons in the channel by use of a gate electrode, and an indispensable element for moleculescale fabrication of switching circuits, logic circuits, and ring oscillators.

In this conventional molecular FET, monomolecules or nanoparticles are inserted between the source and drain electrodes, thereby forming the channel through which electrons are transported. In this case, a gap in which the monomolecules or nanoparticles are inserted needs to be formed between the source and drain electrodes beforehand. To form the gap, an electrode line having a width of several nm may be formed and cut using electromigration. Alternatively, a gap having a greater width may be formed using electron-beam (e-beam) lithography, and then an electrode material may be additionally coated therein using electrochemical deposition such that the gap has a desired width.

In other words, a gate insulating layer formed of oxide and the gate electrode formed of silicon or a metal are sequentially formed on one lateral surface of the channel. Thus, the conventional molecular FET is structured such that current supplied between the source and drain electrodes can be controlled by varying the voltage applied to the gate electrode.

As described above, the conventional molecular FET includes the gate electrode that is contacted with only on one lateral surface of the channel that connects the source and drain electrodes. For this reason, when the gate voltage is changed, there may be no significant difference in the current flowing between the source and drain electrodes.

SUMMARY OF THE INVENTION

The present invention is directed to provide a tri-gated molecular field effect transistor (FET) and a method of fabricating the same, in which a channel is formed by connecting a source electrode and a drain electrode using at least one molecule or nanoparticle, and the three surfaces of the channel having a length of several nm or less are surrounded by a gate electrode. Thus, gate effects on the channel can be maximized so that the variation of current supplied between the source and drain electrodes relative to the gate voltage can be increased.

One aspect of the present invention is to provide a tri-gated molecular FET comprising: a gate electrode formed on a substrate and having grooves in a source region, a drain region and a channel region formed between the source region and the drain region; a gate insulating layer formed on the gate electrode and the substrate corresponding to the source region, the drain region and the channel region; source and drain electrodes formed on the gate insulating layer corresponding to the source region, the drain region and a portion of the channel region; and at least one molecule inserted between the source and drain electrodes in the channel region.

Another aspect of the present invention is to provide a method of fabricating a tri-gated molecular FET comprising: forming a gate electrode having grooves in a source region, a drain region and a channel region formed between the source region and the drain region on a substrate; forming a gate insulating layer on the gate electrode and the substrate corresponding to the source, drain and channel regions; forming a metal pattern on the gate insulating layer corresponding to the source, drain and channel regions; forming a gap by cutting off the metal pattern corresponding to the channel region to complete source and drain electrodes; and inserting at least one molecule in the gap.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Figure 1A:
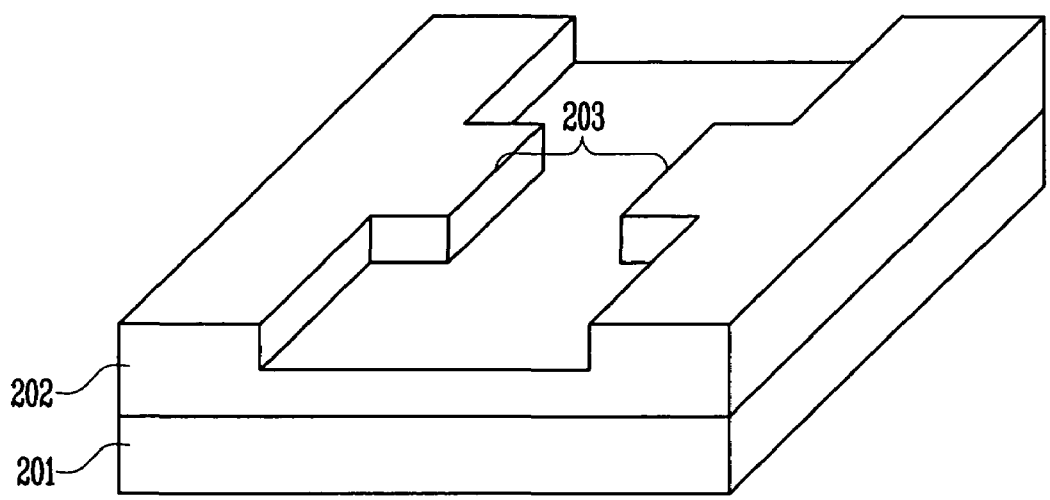
FIGS. 1A through 1E are perspective views illustrating a method of fabricating a tri-gated molecular field effect transistor (FET) according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. It will also be understood that when a layer is referred to as being "on" another layer or substrate, it can be directly on the other layer or substrate or intervening layers may also be present. In the drawings, the thickness of layers and regions are exaggerated for clarity. The same reference numerals are used to denote the same elements in the drawings.

Figure 1B:
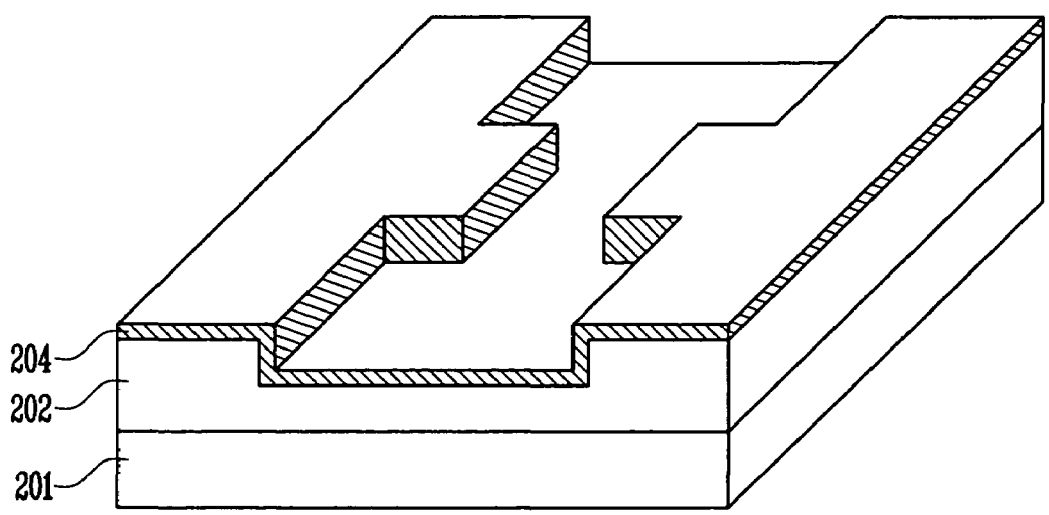
Figure 1C:
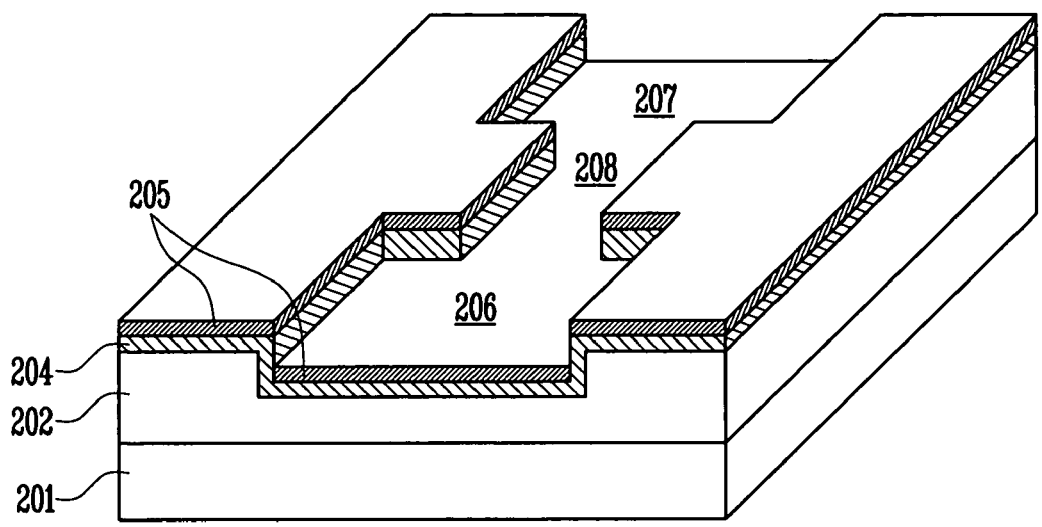
Figure 1D:
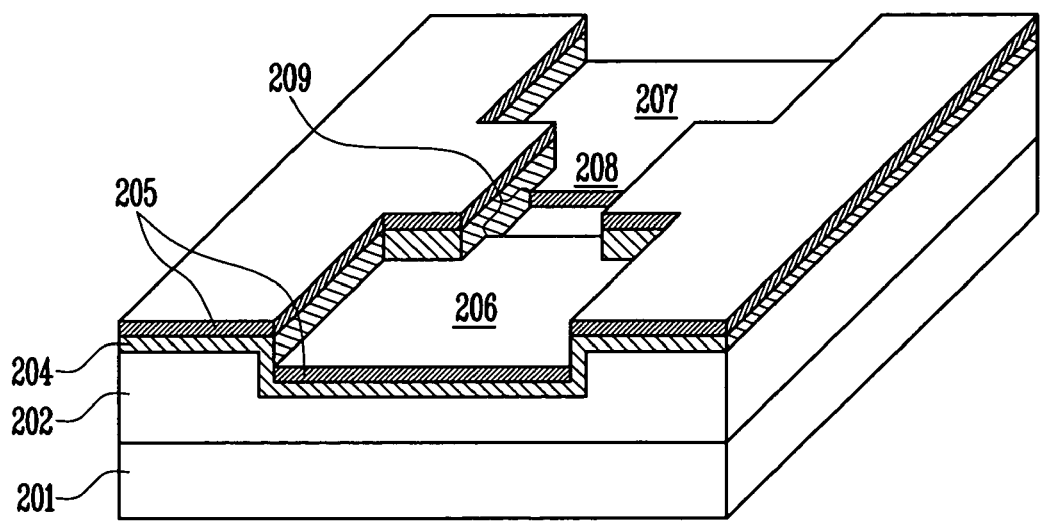
Figure 1E:
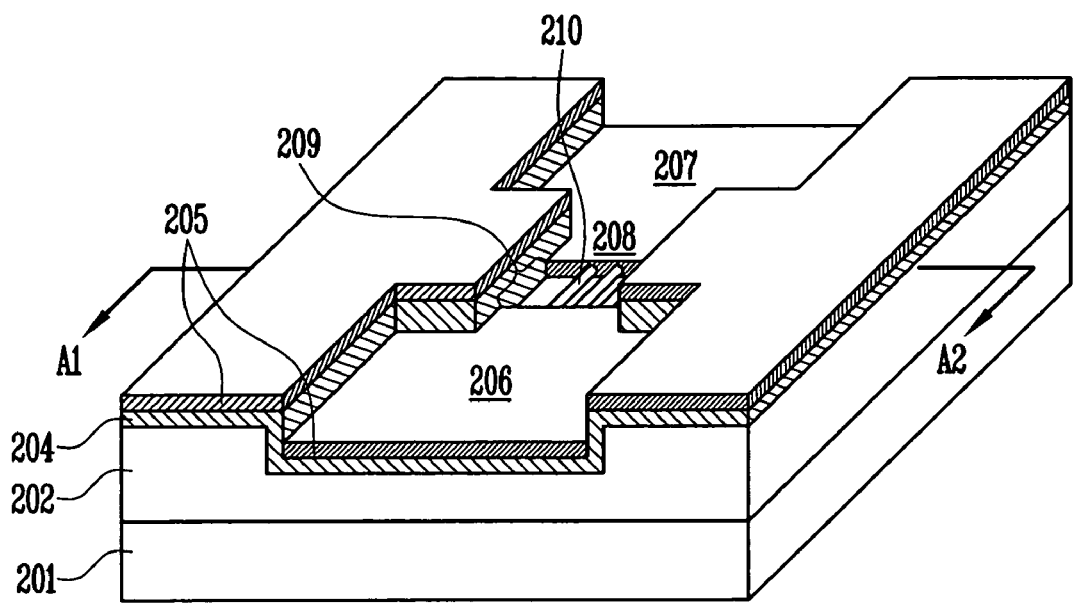
Figure 2:
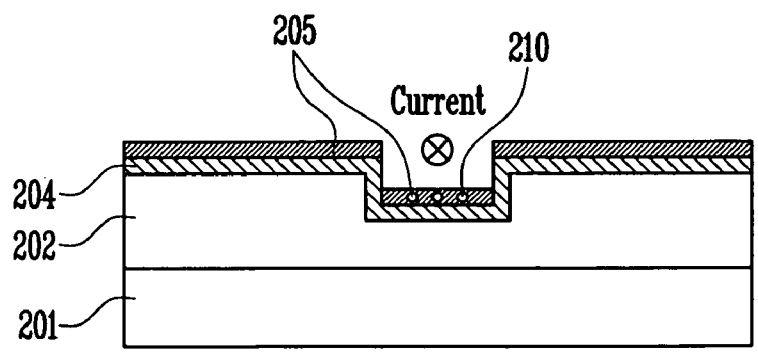
FIG. 2 is a cross sectional view taken along line A1-A2 of FIG. 1E.

FIGS. 1A through 1E are perspective views illustrating a method of fabricating a tri-gated molecular field effect transistor (FET) according to an embodiment of the present invention, and FIG. 2 is a cross sectional view taken along line A1-A2 of FIG. 1E.

Referring to FIG. 1A, a metal or a semiconductor material doped with a large quantity of impurities to improve electric conductivity, is coated on a substrate 201 formed of oxide or nitride and patterned, thereby forming a gate electrode 202 having grooves in a source region, a drain region and a channel region formed between the source region and the drain region, and vertical sidewalls.

In an upper portion of the gate electrode 202, two large grooves for source and drain electrode (206 and 207 of FIG. 1C) that will be formed later and a groove 203 for connecting the grooves are formed in the shape of I. Also, the groove 203 may be formed to a width of few tens of nanometers or less.

Referring to FIG. 1B, a gate insulating layer 204 is formed on the gate electrode 202 and the substrate 201 corresponding to the source, drain and channel regions. The gate insulating layer 204 is formed by oxidizing the surface of the gate electrode 202 or coating an insulating layer having a predetermined thickness on the entire surface of the gate electrode 202.

Referring to FIG. 1C, a metal 205 is coated on the entire surface of the substrate 201 (i.e., on the entire top surface of the gate insulating layer 204) such that a bottom surface of the grooves is filled with the metal 205.

In this case, the metal 205 is coated using a deposition method having poor step coverage, for example, electron-beam (e-beam) evaporation, such that the metal 205 is not deposited on the sidewalls of the grooves. As a result, a metal pattern including two wide pad regions (i.e., the source and drain electrodes 206 and 207) and a nanoline region 208 for connecting the two pad regions is formed on the bottom surface of the grooves.

Referring to FIG. 1D, a predetermined current is supplied between the two pad regions of the metal pattern formed on the bottom surface of the grooves (i.e., between the source and drain electrodes 206 and 207) such that a portion of the nanoline region 208 is cut due to electromigration.

This leads to formation of a gap 209 having a width of several nm or less, in which monomolecules or nanoparticles are stably inserted. The two pad regions 206 and 207, which are disconnected by the gap 209, act as the source and drain electrodes, respectively.

Referring to FIG. 1E, at least one molecule 210 (i.e., monomolecules or nanoparticles) is inserted into the gap 209, thereby forming a channel that connects the source and drain electrodes 206 and 207.

As shown in FIG. 2, the bottom surface and both lateral surfaces of the channel region are surrounded by the gate electrode 202, with the result that a tri-gated molecular FET is completed.

In the foregoing conventional molecular FET, the gate electrode is contacted with only one lateral surface of the channel that connects the source and drain electrodes. However, in the tri-gated molecular FET according to the embodiment of the present invention, the three surfaces of the channel region are surrounded by the gate electrode, so that the gate voltage can have a significant influence on electrons passing through the channel.

According to the present invention as described above, unlike the conventional molecular FET in which the gate electrode is contacted with only one lateral surface of the channel, the three surfaces of the channel are surrounded by the gate electrode so that the gate voltage can have high effects on electrons passing through the channel. Further, a variation gain of current supplied between the source and drain electrodes relative to the gate voltage can be greatly increased. As a result, a molecular electronic circuit with high functionality and reliability can be obtained.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A tri-gated molecular field effect transistor having a source region, a drain region and a channel region between the source region and the drain region, said transistor comprising:
    a substrate;
    a gate electrode formed on the substrate and having three grooves for the source region, the drain region and the channel region of said transistor respectively formed therein;
    a gate insulating layer formed on the gate electrode and in the grooves for the source region, the drain region and the channel region of said transistor;
    source and drain electrodes formed on the gate insulating layer and in the grooves for the source region and the drain region, respectively, of said transistor; and
    at least one molecule inserted between the source and drain electrodes and in the grove for the channel region of said transistor,
    wherein the groove for the channel region is narrower than the grooves for the source and drain regions;
    wherein said at least one molecule defines a channel in the channel region, said channel connects the source and drain electrodes; and at least two side surfaces and a bottom surface of said channel are surrounded by the gate electrode; and,
    wherein said substrate has a top surface that is substantially flat, and said grooves in said gate electrode are formed above said top surface of said substrate.

2. The tri-gate molecular field effect transistor according to claim 1, wherein the groove for the channel region and a gap between the source electrode and the drain electrode have a width of several nanometers.

3. The tri-gate molecular field effect transistor according to claim 1, wherein the molecule includes one selected from the group consisting of monomolecules and nanoparticles.

4. A tri-gated molecular field effect transistor having a source region, a drain region and a channel region between the source region and the drain region, said transistor comprising:
    a substrate;
    a gate electrode formed on the substrate, said gate electrode including raised side portions and a groove between said raised side portions, said groove extending from a portion for the source region to a portion for the drain region via a portion for the channel region of said transistor;
    a gate insulating layer formed on the raised side portions and in the groove of the gate electrode;

source and drain electrodes formed on the gate insulating layer in the portions of said groove for the source region and the drain region of said transistor, respectively, said source and drain electrodes being spaced by a gap in the portion of the groove for the channel region of said transistor; and at least one molecule inserted in the gap between the source and drain electrodes to define a channel in the channel region, said channel connects the source and drain electrodes, wherein said channel is surrounded by conductive material of said gate electrode at the bottom of said groove and in the raised side portions;

wherein the portion of the groove for the channel region is narrower than the portions of the groove for the source and drain regions; and wherein said substrate has a top surface that is substantially flat, and said groove in said gate electrode is formed above said top surface of said substrate.

5. The tri-gate molecular field effect transistor according to claim 4, wherein the channel region and the gap between the source electrode and the drain electrode have a width of several nanometers.

6. The tri-gate molecular field effect transistor according to claim 4, wherein the molecule includes one selected from the group consisting of monomolecules and nanoparticles.

7. The tri-gate molecular field effect transistor according to claim 4, wherein side walls at boundaries between the groove and the raised side portions of the gate electrode are covered by the gate insulating layer; and the gate insulating layer on said side walls is exposed to the source region, drain region and channel region.

8. The tri-gate molecular field effect transistor according to claim 7, further comprising metal layers that cover the gate insulating layer on the raised side portions but do not cover the gate insulating layer on said side walls.

* * * * *